US006220456B1

(12) United States Patent
Jensen et al.

(10) Patent No.: US 6,220,456 B1
(45) Date of Patent: Apr. 24, 2001

(54) METHOD AND APPARATUS FOR SUPPORTING A COMPUTER CHASSIS

(75) Inventors: Ralph Warren Jensen; Steve Sands, both of Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/552,137

(22) Filed: Apr. 19, 2000

(51) Int. Cl.⁷ ........................................................ A47F 5/00
(52) U.S. Cl. ............................. 211/26; 211/189; 361/829
(58) Field of Search ...................... 211/26, 189; 361/829, 361/683, 729; 312/223.2, 265.4

(56) References Cited

U.S. PATENT DOCUMENTS

| | | | |
|---|---|---|---|
| 2,740,944 | * | 4/1956 | Harrison et al. . |
| 4,715,502 | * | 12/1987 | Salmon .................................. 211/26 |
| 5,332,306 | * | 7/1994 | Babb et al. . |
| 5,340,340 | * | 8/1994 | Hastings et al. . |
| 5,571,256 | | 11/1996 | Good et al. ............................ 211/26 |
| 5,599,080 | * | 2/1997 | Ho . |
| 5,788,087 | * | 8/1998 | Orlando ................................. 211/26 |
| 5,833,337 | | 11/1998 | Kofstad .............................. 312/334.5 |
| 5,867,372 | * | 2/1999 | Shie ................................. 361/829 X |
| 5,890,602 | * | 4/1999 | Schmitt .............................. 211/26 X |
| 5,941,621 | | 8/1999 | Boulay et al. ..................... 312/334.4 |
| 6,021,047 | | 2/2000 | Lopez et al. ......................... 361/727 |
| 6,050,658 | * | 4/2000 | O'Sullivan et al. .......... 312/223.2 X |
| 6,123,203 | * | 9/2000 | Gibbons ................................. 211/26 |

FOREIGN PATENT DOCUMENTS

WO 9847411   10/1998 (WO) .

OTHER PUBLICATIONS

Abstract of Japanese Patent No. 11127993, May 18, 1999.

* cited by examiner

Primary Examiner—Robert W. Gibson, Jr.
(74) Attorney, Agent, or Firm—Baker Botts L.L.P.

(57) ABSTRACT

A method and apparatus for supporting a computer chassis (12). A rack-mounted computer system is provided that includes at least two posts (16). A rail (20) is attached to each post (16). Each of the rails (20) includes two ribs (24) that together define a slot (26). One portion (28) of the slot (26) has a greater separation between the ribs (24). A computer component chassis (12) that needs to be mounted includes two faces (100,102) on its outer surface. Each face has at least one protuberance (104). The protuberances (104) are shaped to fit at least partially into the slot (26) of one of the rails (20) at the portion (28) having greater separation.

14 Claims, 3 Drawing Sheets

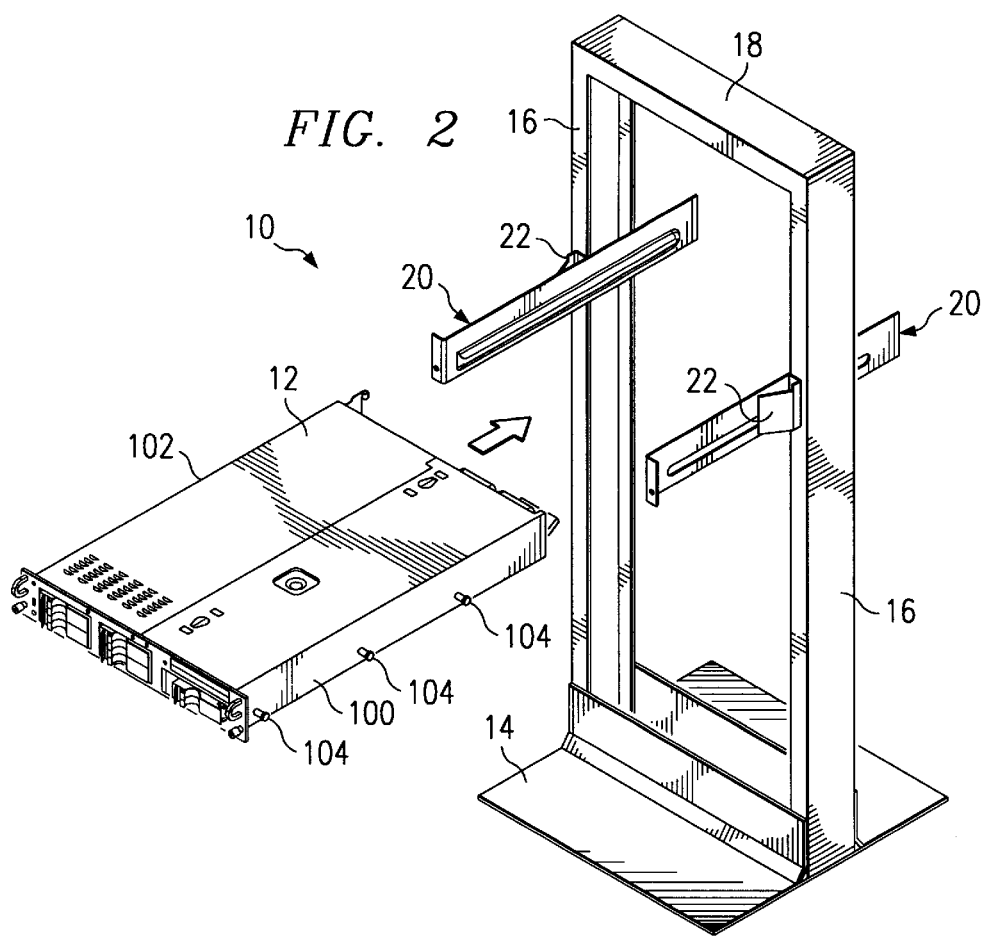
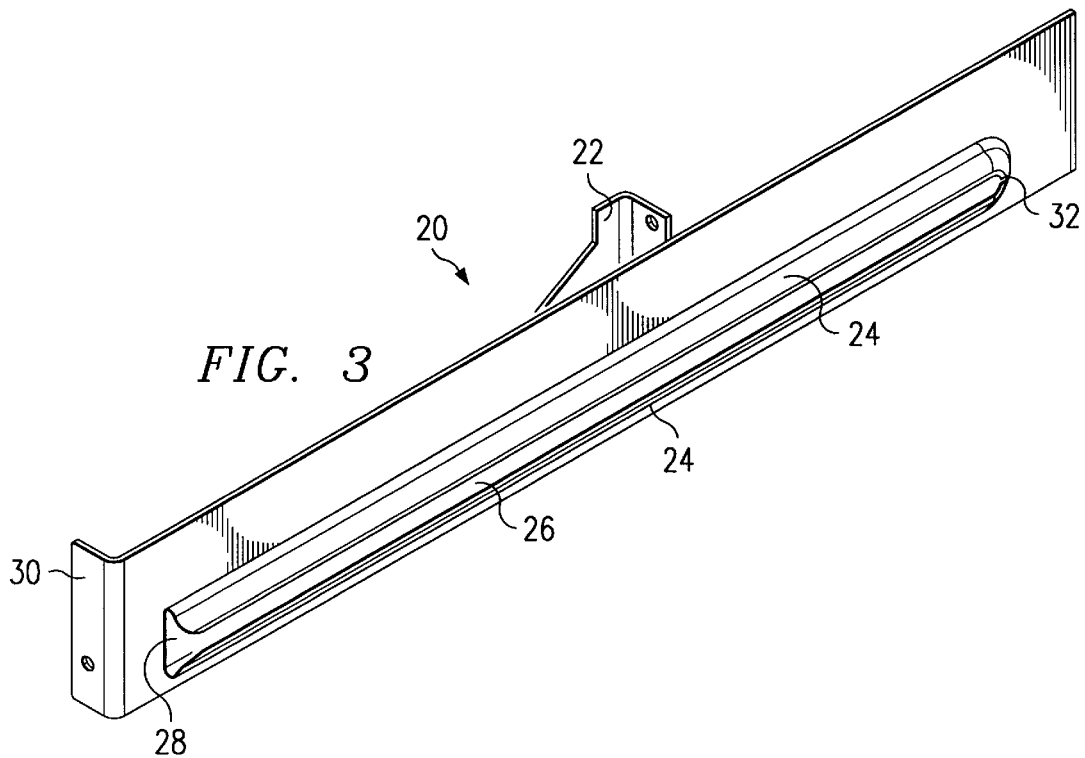

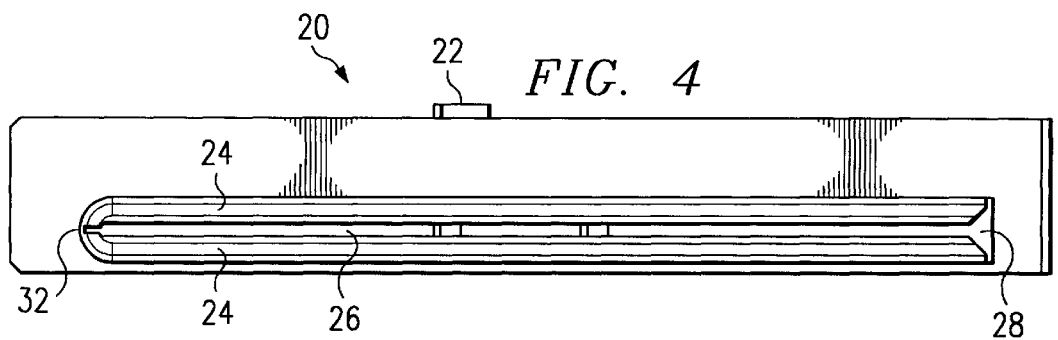
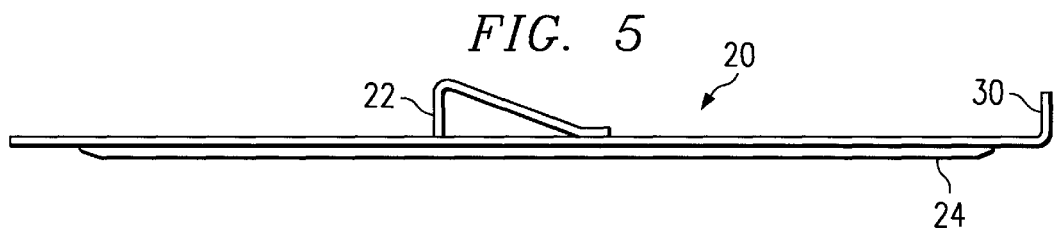
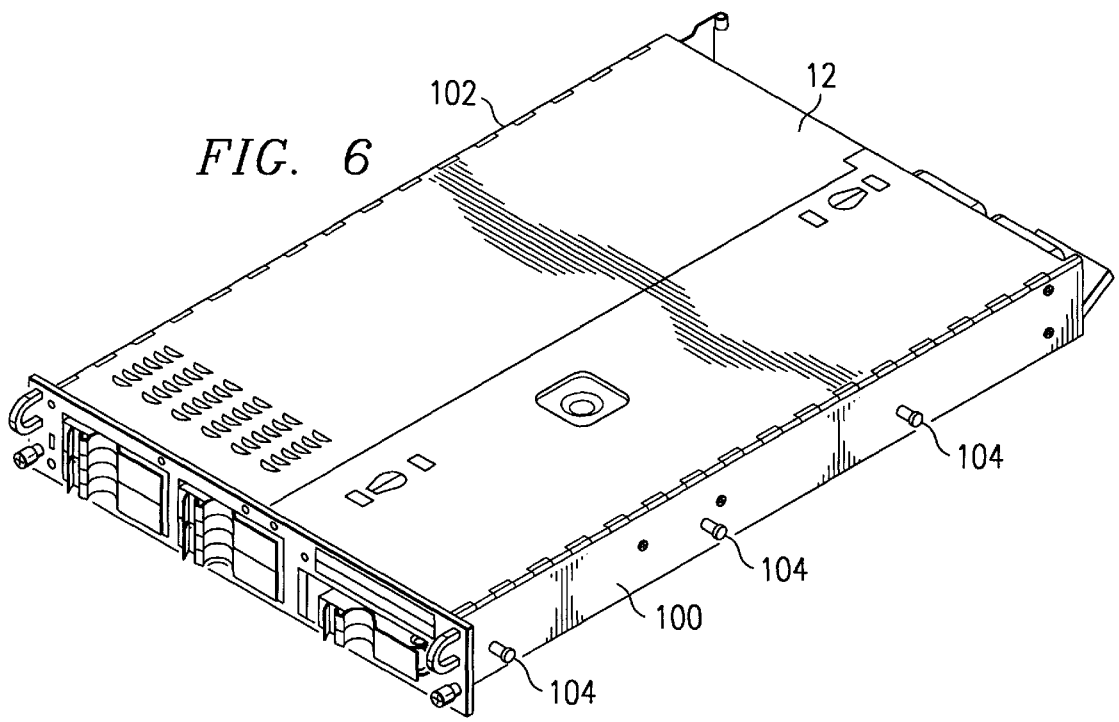

METHOD AND APPARATUS FOR SUPPORTING A COMPUTER CHASSIS

TECHNICAL FIELD OF THE DISCLOSURE

The present disclosure relates in general to computer systems, and, more particularly, to a method and apparatus for supporting a computer chassis.

BACKGROUND OF THE DISCLOSURE

Computer systems shrink in size and increase in power at an astounding rate. While computer users were at one time willing to dedicate an entire floor or even building to computer components, today the market demands that computer power be provided with a small footprint. Footprint is the amount of floorspace that is taken up by the computer component. In order to minimize floorspace, large multi-component computer systems are often arranged in racks. The computer components are provided in a standard-sized, rectangular chassis. Each chassis is stacked in a rack so that a large number of computer components can be stored in a space having the footprint of a single chassis.

A conventional rack may have two posts to which shelves are attached in between. The computer components can then be placed on the shelves. This arrangement wastes vertical space because the shelves separate each computer chassis from the ones above and below it.

Another conventional rack may have four posts arranged in a rectangle with each computer chassis attached to all of the posts. Unfortunately, this arrangement increases the labor necessary to perform computer administration, because the chassis is detached at each post when removed. When a chassis is fixed in position with neighbors above and below it, removal is necessary to access the inside of the chassis. Once the chassis is detached from the posts, it is no longer supported and may be dropped and damaged or else moved to a surface such as a table for work to be done.

A third conventional system may use ball bearing mounted, multi-part, sliding arms that are attached to the inside of a cabinet. The arms are then fixedly attached to the sides of a chassis. These mounting systems are very expensive. They may allow access to a chassis, but removing or adding a chassis may still involve the task of detaching screws or bolts.

SUMMARY OF THE DISCLOSURE

A method and apparatus for supporting a computer chassis are disclosed that provide one or more significant advantages. None of the advantages, by itself, is critical or necessary to the disclosure.

A rack-mounted computer system is provided that includes at least two posts. A rail is attached to each post. Each of the rails includes two ribs that together define a slot. One portion of the slot has a greater separation between the ribs. A computer component chassis that needs to be mounted includes two faces on its outer surface. Each face has at least one protuberance. The protuberances are shaped to fit at least partially into the slot of one of the rails at the portion having greater separation.

A more specific computer system is also provided in which the protuberances are shaped like stand-off bolts. The head of the protuberance is thick enough to fit through the widened portion of the slot, but not the rest of the slot. The body of the protuberance is thin enough to fit throughout the slot. Therefore, once insertion occurs at the widened portion, the protuberance can be moved along the slot and will not fall out, unless pulled back out through the widened portion.

A more specific computer system is also provided in which the ribs defining the slot thin as they approach the widened portion. As the heads of the protuberances on either side of the chassis are moved into their slots, the rib thickens and forces the heads away from each other. The tension in the protuberances provides extra stability in the sliding engagement of the protuberances with the slots, while allowing easy insertion at the widened portions.

A method is provided for supporting a computer chassis. Two posts are attached to a base so that they are nearly parallel, within five degrees. A rail is attached nearly perpendicularly to each post. The rails are positioned nearly parallel to each other and at the same distance from the base. A computer chassis is inserted so that at least one protuberance on the chassis is engaged in a slot defined by ribs on the first rail and at least one protuberance is engaged in a slot defined by ribs on the second rail.

An more specific method attaches two additional, nearly parallel posts to the base. Each of the rails is attached to two of the four posts.

An alternate method positions two rails at the same height, nearly parallel, and far enough apart to allow a computer chassis to be positioned between them. The computer chassis is provided with a set of colinear protuberances on each of two opposite sides. The protuberances on each side are slid into slots in the rails so that the chassis is supported on both sides.

It is a technical advantage of the disclosed methods and apparatus that computer components are supported in a vertical arrangement.

It is a technical advantage of the disclosed methods and apparatus that the rails can be inexpensively manufactured without separate parts that move relative to each other.

Another technical advantage of the apparatus and method disclosed is that no vertical space is wasted by the support structure. More computer components can fit into the same rack resulting in less footprint per component.

Another technical advantage of the apparatus and method disclosed is that a computer component chassis can slide partially out of the rack for access purposes.

Another technical advantage of the apparatus and method is that a chassis can be removed from the rack with removing screws or fasteners.

Another technical advantage of the apparatus and method is that secure positioning is maintained by tension between the rails.

Other technical advantages of the present disclosure will be readily apparent to one skilled in the art from the following figures, descriptions, and claims. An embodiment of the disclosure may address one, many or none of the above-disclosed technical advantages.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein:

FIG. 2 illustrates a method of supporting a computer chassis;

FIG. 3 is an isometric view of a support rail according to one embodiment of the present disclosure;

FIG. 4 is a side view of the support rail of FIG. 3;

FIG. 5 is a top view of the support rail of FIG. 3; and

FIG. 6 is an isometric view of a computer component chassis according to one embodiment of the present disclosure.

DETAILED DESCRIPTION OF THE DISCLOSURE

Figure 1:
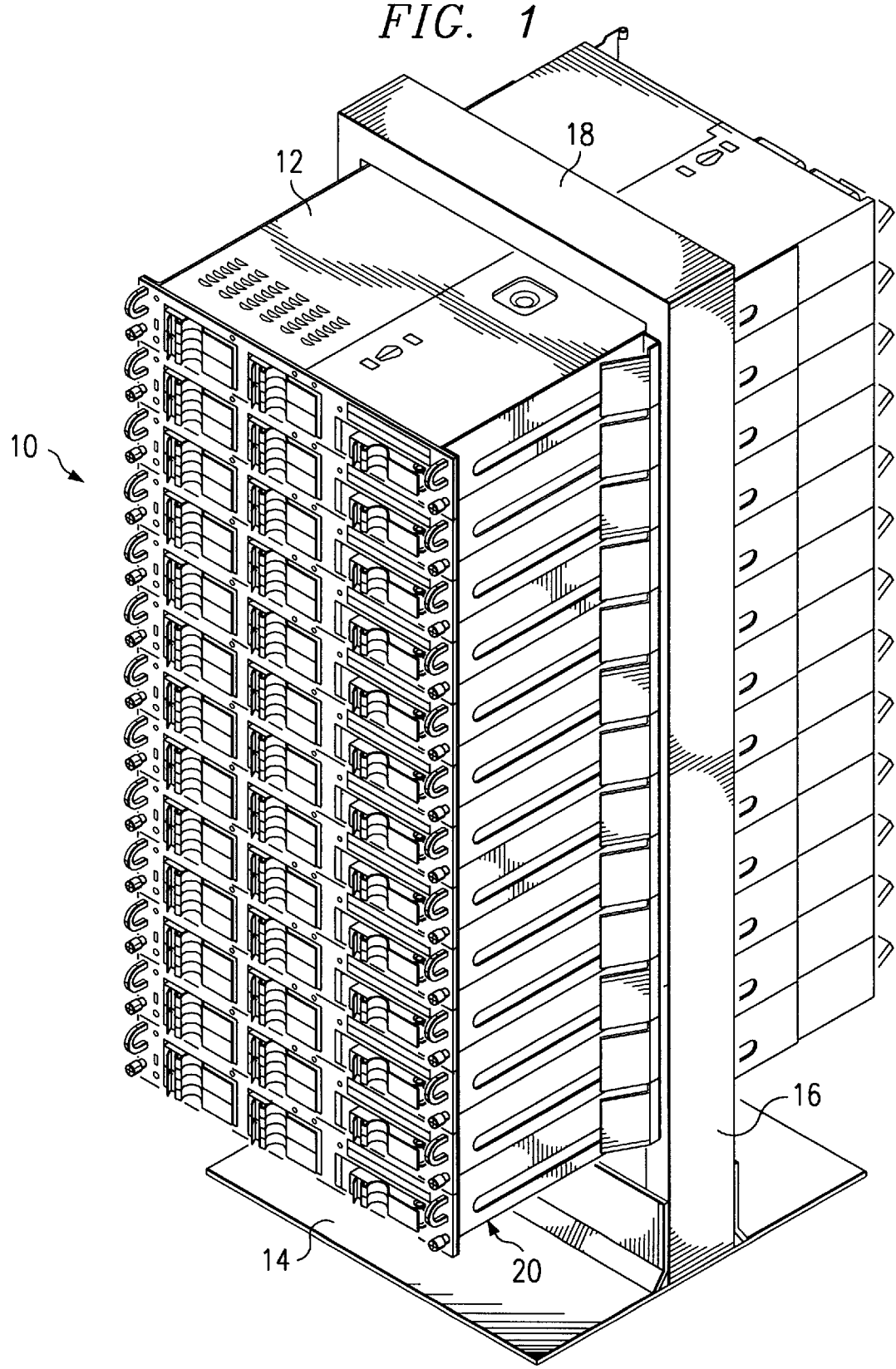
FIG. 1 illustrates a two post embodiment of an apparatus for supporting computer components.

FIG. 1 illustrates a two post embodiment of an apparatus for supporting computer components. The rack 10 includes a base 14. Two posts 16 are attached to the base 14 and extend vertically and within five degrees of parallel. The predominate dimension of the posts 16 is lengthwise, shown as vertical in the figure. Extra stability can be achieved by connecting a top member 18 to each post 16. Support rails 20 are fixedly attached to the inside of the posts 16. The posts 16 include apertures separated by a standard distance for attachment. The rails 20 are fixedly attached using apertures closest together in vertical level. In an alternate embodiment, the posts 16 do not have apertures and the rails 20 are attached within a centimeter of the same height on each post 16.

The predominate dimension of the rails 20 is lengthwise, shown in the figure as horizontal and perpendicular to the plane formed by the base 14, posts 16, and top member 18. The rails 20 can be attached near their centers. Each computer component chassis 12 is supported by rails 20 on either side. In an alternate embodiment, extra posts can be provided to support the rails 20.

FIG. 2 illustrates a method of supporting a computer chassis. The base 14, posts 16, and top member 18 are assembled. The rails 20 include a triangular weldment bracket 22. The bracket 22 is fixedly attached to the post 16 to support the rail 20. Other means of attaching the rails 20 to the posts 16 may also be used. The computer chassis 12 is provided with stand-off bolts 104 on both opposite sides 100,102. Other protrusions besides bolts 104 may also be used. The chassis 12 is moved along the rails 20 until it is positioned between them. As the chassis 12 moves between the rails 20 the bolts 104 engage the rails 20. After engagement the chassis 12 is vertically supporting by the bolts 104 which may move horizontally but not vertically relative to the rails 20. The chassis 12 is removed from the rack 10 by horizontal movement relative to the rails 20.

FIG. 3 is an isometric view of a support rail 20 according to one embodiment of the present disclosure. The rail 20 includes a triangular weldment bracket 22 for mounting purposes. The rail 20 also includes ribs 24 that extend out from the plane of the rail 20. The ribs 24 are separated by a distance that defines a slot 26. At one end a portion 28 of the slot 26 is widened by a lead-in angle in the ribs 24. An alternate embodiment of the invention could have a slot 26 abruptly widened by a perpendicular cessation of the ribs 24. The other end 32 of the slot 26 does not widen as the ribs 24 angle back into the plane of the rail 20.

Viewing FIGS. 2 and 3 together, the bolts 104 have heads that are too wide to fit through the slot 26. The body of the bolt 104 is slender enough to fit in the slot 26. The head of the bolt 104 can enter the widened portion 28 of the slot 26. The ribs 24 separate the head of the bolt 104 from the side 102 of the chassis 12. While the body of the bolt 104 connects the two. The chassis 12 is guided into the gap between the rails 20 by a flange 30 on each rail 20. The flange 30 reduces the chance that a chassis 12 will be damaged by an unaligned insertion attempt. If the corner of the flange 30 is curved, it can act as a guide.

The thickness of the ribs 24 can vary in order to ease insertion of the protuberance 104 while enhancing stability of the chassis 12. The inside face of the rib 24, which faces the chassis 12, can be flat relative to the rail surface while the outside face of the rib 24 gradually sinks toward the chassis 12 as the rib 24 approaches the widened portion 28. This combination indicates that the rib 24 is thinning. When the bolts 104 on opposite sides of a chassis 12 are placed in the slots 26 at the widened portions 28 there may be some slack in the distance between the ribs 24 of the two supporting rails 20 allowing for easy insertion. As the bolts 104 is slid into the slots 26, the outside faces of the ribs 24 incline away from the chassis 12 and the fit becomes tighter so that some tension develops between the head of the bolts 104 and the ribs 24. This tension prevents possibly damaging, unintended movements in the chassis 12. In an alternate embodiment the ribs 24 would have the same thickness throughout, but would extend further from the rail 20 surface near the widened portion 28 such that the head of the protuberance 104 would encounter the same incline and the same tension would result.

FIG. 4 is a side view of the support rail 20 of FIG. 3. The ribs 24 define a slot 26 having a closed end 32 and a widened portion 28 at the other end. The bracket 22 can be seen through the slot 26. The angular configuration of the widened portion 28 of this embodiment of the disclosure is more clearly visible from the side. As discussed above, many alternate configurations of the widened portion are possible. FIG. 5 is a top view of the rail 20. This view shows the triangular weldment bracket 22 and the flange 30. The top view also shows the departure of the ribs 24 from the planar surface of the rail 20.

FIG. 6 is an isometric view of a computer component chassis according to one embodiment of the present disclosure. The two bolts 104 on each of the opposite sides 100,102 of the chassis 12 are colinear so that both can fit into the rail 20 at one time. The stability of the support is increased if the bolts 104 are spread over a greater proportion of the length of the chassis 12. The rail 20 and the slot 26 must also be long enough to hold all of the bolts 104 simultaneously or the stability will not be achieved.

In an alternate embodiment, a protuberance 104 other than a bolt can be mounted on the chassis 12 and engaged in the slots 26. Greater stability can be achieved if the protuberance 104 includes a first portion that fits into the widened portion 28 of the slot 26, but not through other parts of the slot 26. A second portion of the protuberance 104 can connect the first portion to the chassis 12 while being slender enough to slide throughout the slot 26.

In another alternate embodiment four nearly parallel posts 16 are attached to the base 14. Each rail 20 is attached at its ends to two posts 16.

Although the present disclosure has been described in detail, it should be understood that various changes, substitutions and alterations can be made thereto without departing from the spirit and scope of the invention as defined by the appended claims.

What is claimed is:

1. A rack-mounted computer system comprising:
    a plurality of posts;
    at least first and second rails, each rail fixedly attached to at least one of the plurality of posts, each rail having two ribs defining a slot, each slot having a widened portion;
    at least one computer component chassis, the chassis having an outer surface with first and second faces;

the first and second faces each having at least one protuberance extending away from the outer surface;

the protuberances shaped to be inserted at least partially into the widened portion of one of the slots and to slide within the slot; and wherein each protuberance has first and second portions, the first portion located in closer proximity to the chassis outer surface than the second portion, and the first portion having a smaller diameter than the second portion.

2. The computer system of claim 1, wherein the diameter of the second portions of the protuberances is more than the diameter of the slots and less than the diameter of the widened portions.

3. The computer system of claim 2, wherein the protuberances are portions of bolts.

4. A rack-mounted computer system comprising:

a plurality of posts;

at least first and second rails, each rail fixedly attached to at least one of the plurality of posts, each rail having two ribs defining a slot, each slot having a widened portion;

at least one computer component chassis, the chassis having an outer surface with first and second faces;

the first and second faces each having at least one protuberance extending away from the outer surface;

the protuberances shaped to be inserted at least partially into the widened portion of one of the slots and to slide within the slot; and wherein the average thickness of a portion of the ribs of each rail proximate to the widened portion of the slot decreases relative to the ribs further separated from the widened portion.

5. A rack-mounted computer system comprising:

a plurality of posts;

at least first and second rails, each rail fixedly attached to at least one of the plurality of posts, each rail having two ribs defining a slot, each slot having a widened portion;

at least one computer component chassis, the chassis having an outer surface with first and second faces;

the first and second faces each having at least one protuberance extending away from the outer surface;

the protuberances shaped to be inserted at least partially into the widened portion of one of the slots and to slide within the slot; and wherein each of the first and second rails is attached to one of the posts in a position less than five degrees from perpendicular with that post and the slots of the rails positioned less than five degrees from parallel with each other.

6. The computer system of claim 5, wherein the posts are each attached at one end to a base and positioned less than five degrees from parallel with each other.

7. The computer system of claim 6, wherein the first and second faces of the computer component chassis outer surface are within five degrees of parallel, the distance between the slots of the first and second rails exceeds the distance between the faces, and the distance between the protuberances on the faces exceeds the distance between the slots.

8. A rack-mounted computer system comprising:

a plurality of posts;

at least first and second rails, each rail fixedly attached to at least one of the plurality of posts, each rail having two ribs defining a slot, each slot having a widened portion;

at least one computer component chassis, the chassis having an outer surface with first and second faces;

the first and second faces each having at least one protuberance extending away from the outer surface;

the protuberances shaped to be inserted at least partially into the widened portion of one of the slots and to slide within the slot;

wherein the posts are each attached at one end to a base and positioned less than five degrees from parallel with each other and each rail is fixedly attached to a side of one of the posts that faces another post; and wherein the ribs of each rail extend away from the post to which that rail is attached.

9. A method for supporting a computer chassis comprising the steps of:

attaching first and second posts to a base, each post having a predominate dimension, so that the posts are less than five degrees from parallel along their predominate dimension;

attaching a first rail having a predominate dimension to the first post with the predominate dimension of the first rail within five degrees of perpendicular to the predominate dimension of the first post;

attaching a second rail having a predominate dimension to the second post with the predominate dimension of the second rail within five degrees of perpendicular to the predominate dimension of the second post, the first and second rails attached at the same distance from the base;

moving a computer chassis relative to the rails;

engaging protuberances on the computer chassis in a slot defined by ribs on the first rail; and engaging protuberances on the computer chassis in a slot defined by ribs on the second rail.

10. The method of claim 9, wherein the steps of attaching the rails to the first and second posts comprise attaching each rail at a midpoint of the rail.

11. A method for supporting a computer chassis comprising the steps of:

providing at least one set of colinear protuberances on each of two opposites sides of the computer chassis extending away from the side;

positioning first and second rails at the same height;

positioning the rails within five degrees of parallel;

positioning the rails so that slots defined by ribs on the rails are at a distance greater than the distance between the opposite sides of the computer chassis;

positioning the computer chassis with each of the two opposites sides facing one of the rails and with the first of each set of colinear protuberances within a widened portion of each slot; and sliding the sets of linear protuberances into the slots of the rails facing the side of the computer chassis from which the protuberances extend.

12. The method of claim 11, wherein the ribs defining the slots have a lesser average thickness adjacent to the widened portion of the slot than the average thickness at a portion of the ribs further separated from the widened portion of the slot.

13. The method of claim 12, wherein a side of each rib facing the computer chassis is flat and a side of each rib facing away from the computer chassis is inclined adjacent to the widened portion of the slot whereby the average thickness of each rib is less adjacent to the widened portion of the slot.

14. The method of claim 13, wherein each protuberance has first and second portions, the first portion located in closer proximity to the chassis surface than the second portion, and the first portion having a smaller diameter than the second portion;

the step of positioning the computer chassis comprises placing the ribs between the second portion of the first of each set of colinear protuberances and the chassis side facing the rail; and the step of sliding the protuberances comprises moving the second portion of the first protuberance laterally along the inclined side of the rib whereby tension is placed on the protuberance.

* * * * *